(12) United States Patent
Laaksonen et al.

(10) Patent No.: US 6,229,738 B1
(45) Date of Patent: May 8, 2001

(54) RESETTABLE MEMORY STRUCTURE

(75) Inventors: Esa Laaksonen, Hyvinkää ; Mika Rintamäki, Espoo, both of (FI)

(73) Assignee: Nokia Telecommunications Oy, Espoo (FI)

( * ) Notice: Subject to any disclaimer, the term of this patent is extended or adjusted under 35 U.S.C. 154(b) by 0 days.

(21) Appl. No.: 09/319,301

(22) PCT Filed: Dec. 10, 1997

(86) PCT No.: PCT/FI97/00773

§ 371 Date: Jul. 15, 1999

§ 102(e) Date: Jul. 15, 1999

(87) PCT Pub. No.: WO98/28844

PCT Pub. Date: Jul. 2, 1998

(30) Foreign Application Priority Data

Dec. 11, 1996 (FI) .......................................... 964950

(51) Int. Cl.$^7$ ...................................... G11C 7/00

(52) U.S. Cl. ................... 365/189.05; 365/189.12

(58) Field of Search ................ 365/78, 189.05, 365/189.12; 327/200, 201, 218

(56) References Cited

U.S. PATENT DOCUMENTS 5,787,456 * 7/1998 Nakayama ..................... 365/189.05
5,805,506 * 9/1998 Matsui ............................ 365/189.05
6,058,448 * 5/2000 Pawlowski ...................... 365/189.05
6,078,528 * 6/2000 Johnson et al. ................. 365/189.05

FOREIGN PATENT DOCUMENTS

0637132 A2  2/1995 (EP) .
WO 9638915 A1  12/1996 (WO) .

OTHER PUBLICATIONS

Patent Abstracts of Japan, vol. 13, No 330, E–793 abstract of JP 1–93916 A (Fujitsu Ltd.), Apr. 12, 1989.
Patent Abstracts of Japan, vol. 12, No 38, E–580 abstract of JP 62–190917 A (NEC Corp.), Aug. 21, 1987.

* cited by examiner

*Primary Examiner*—Son T. Dinh
(74) *Attorney, Agent, or Firm*—Altera Law Group, LLC

(57) ABSTRACT

The structure according to the invention employs a latch circuit without a reset input as a structural unit for memory. The memory structure's input bus is duplicated and the value of the first bus is forced to "0000" and the value of the second bus is forced to "1111". In a reset state the latch circuits are driven transparent so that each memory bit's reset state depends on which of the buses the latch circuit is connected to. The structure according to the invention fulfils the requirement of an arbitrarily selectable reset state while at the same time the memory can be implemented using the smallest possible elements, i.e. latch circuits without reset inputs.

4 Claims, 5 Drawing Sheets

RESETTABLE MEMORY STRUCTURE

FIELD OF THE INVENTION

The invention relates to memory structures embedded in integrated circuits, in particular to registers in application specific integrated circuits (ASIC).

DESCRIPTION OF RELATED ART

Registers embedded in application specific integrated circuits are typically realised using latches or flip-flops. The design of a memory embedded in an application specific integrated circuit, in which the reset state of each bit can be arbitrarily set to '1' or '0' in the design phase is difficult and the result is complex and space-consuming.

The problem with a latch circuit equipped with an asynchronous reset input is that ASIC component libraries not always include such elements. If a component library does include such an element, latch circuits settable to both '1' and '0' states are typically not available in one and the same library. If one wants to use a resettable latch circuit in order to realise a memory bit resettable into a logic one, the latch circuit has to be surrounded with two inverters, one before the latch circuit and another after the latch circuit on the latch circuit's datapath. Such a construction increases space consumption. Furthermore, a resettable latch circuit usually is one gate bigger than a latch circuit without a reset input, and the distribution of the reset control signal to the latch circuits requires space.

If all memory elements could be reset into the same state ('1' or '0'), latch circuits without reset inputs could be used as memory elements, and the setting or reset states could be carried out by forcing the latch circuits transparent for the duration of the reset state so that the state of the data bus brought to the latch circuits would appear at the outputs of the latch circuits, and by forcing the bus into the desired state. Such a construction, however, does not meet the requirement of an arbitrary reset state.

A resettable memory can also be realised using flip-flops, or clocked edge-triggered elements. A resettable flip-flop in accordance with good design practice which has a 2:1 multiplexer for input data, as required by the scan test method, and a synchronous enable multiplexer takes about 20 gates in a gate array circuit implemented with CMOS technology. Furthermore, reset and scan enable controls have to be brought to each such element, requiring both wiring space and buffering. Space consumption could be reduced by leaving out functions, but a flip-flop always takes more space than a latch.

SUMMARY OF THE INVENTION

An object of the invention is to provide a structure for realising a memory embedded in an ASIC in which each bit can upon reset be arbitrarily set into either '0' or '1'. Another object of the invention is to realise such a structure which is smaller and simpler than the solutions in the prior art and requires fewer gates in the ASIC.

These and other objects of the invention are achieved by realising the memory bits with latch circuits without reset inputs, duplicating the memory structure's input bus, adding to both buses switch elements which in the reset state force all lines of one bus to '0' and all lines of the other bus to '1', and by connecting each latch circuit to one of the buses according to the desired value in the reset state.

The memory structure according to the invention is characterised in that it comprises at least one switch element connected between a certain line on the memory structure's data bus and a corresponding line on at least one memory element's data bus, said switch element being such that in response to a reset signal it connects a predetermined value to said memory element's input line.

The structure according to the invention uses a latch circuit without a reset input as a structural unit for memory. The memory structure's input bus is duplicated, and the first bus is forced to have the value "0000" in the reset state, and the second bus is forced to have the value "1111". In the reset state the latch circuits are forced transparent so that the reset state of each memory bit depends on which of the buses the latch circuit is connected to. The structure according to the invention fulfills the requirement of an arbitrarily selectable reset state while at the same time the memory can be realised using the smallest possible elements, i.e. latch circuits without reset inputs.

BRIEF DESCRIPTION OF THE DRAWINGS

The invention will now be described in more detail with reference to the preferred embodiments presented by way of example and to the accompanying drawing wherein.

Like elements in the Figures are denoted by like reference designators.

DETAILED DESCRIPTIONS OF THE INVENTION

Figure 1:
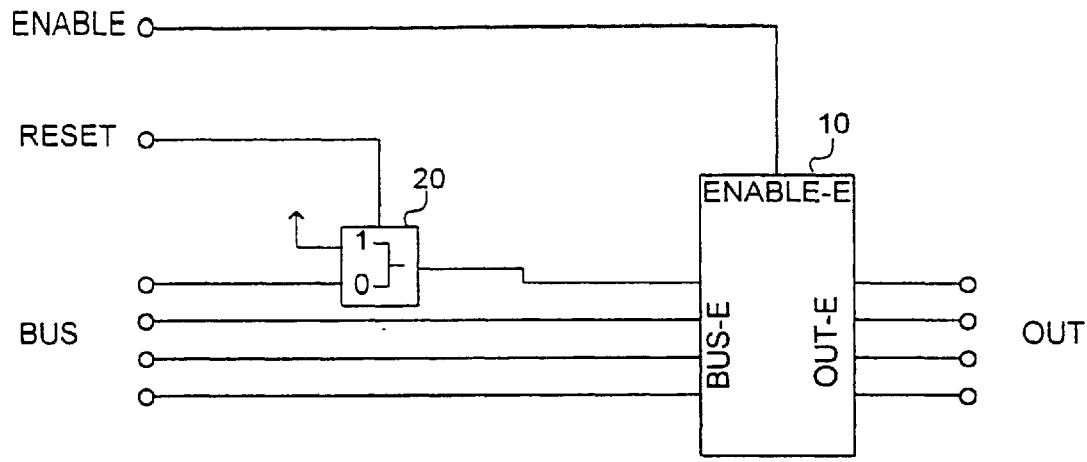
FIG. 1 shows an embodiment according to the invention.
Figure 2:
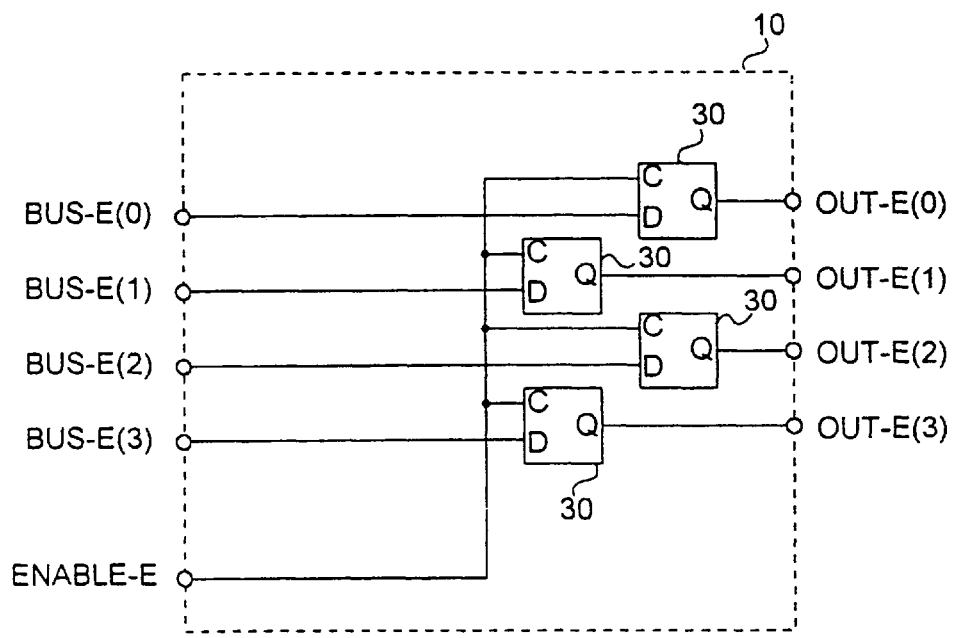
FIG. 2 shows the structure of a memory element 10 used in the embodiment shown in FIG. 1.

FIG. 1 shows a preferred embodiment of the invention. In it, the structure according to the invention comprises a memory element 10 and one switch element 20. The structure of the memory element 10 is advantageously similar to that shown in FIG. 2. The memory element 10 comprises latch circuits 30 which there are one per each memory bit in the memory element. The latch circuits 30 are preferably latches without reset inputs. As a signal is brought to the ENABLE-E control input in the memory element 10, the latch circuits 30 set their output Q values equal to the values at their inputs D. The embodiment according to FIG. 1 can be advantageously used in cases where the lines of the bus (BUS) are set to a certain state in a reset situation. Then, by means of the switch element 20, the reset value of a desired bit can be set such that it differs from the reset value of the bus. The exemplary switch element 20 shown in FIG. 1 has one control input connected to the memory structure's RESET input, two signal inputs, the first of which is connected to a certain line on the memory structure's input bus (BUS) and the second to a desired fixed voltage level, and one output connected to one line on the memory element's 10 input bus. The value of the switch element's control input determines which one of the switch element's two signal input values is taken to the switch element's output. In a normal situation, the switch element's 20 output has the value of that signal input which is connected to a line on the memory structure's input bus (BUS), and in a reset situation, said output has the fixed value of said second signal input. Resetting of the memory structure according to FIG. 1 is carried out in such a manner that the beginning of a reset signal is first brought to the memory structure's RESET input whereby the switch element's 20 output gets the fixed value of said second signal input, whereafter a control signal, e.g. a control pulse, is brought to the memory structure's ENABLE input so that the lines on the memory structure's output bus OUT are set to values set by the input lines and switch element 20. After that, the memory structure is restored to the normal situation by removing the reset signal from the RESET input.

The memory structure according to the invention may also use more than one switch element. Preferably there is one switch element per each line the reset-state value of which has to be different than the reset-state value of the corresponding line on the input bus.

Figure 3:
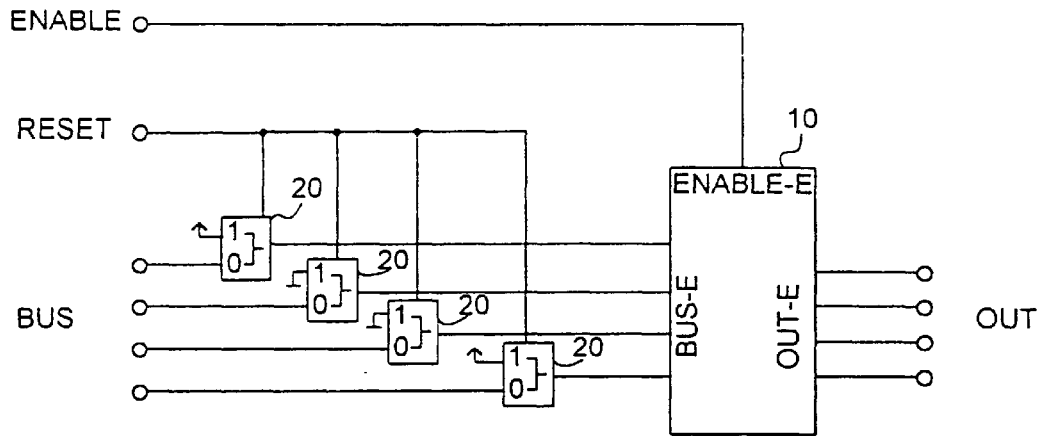
FIG. 3 shows a second preferred embodiment of the invention.

In the memory structure according to the invention each input bus line may have a switch element as shown in FIG. 3. This kind of an embodiment can be advantageously used when the input bus (BUS) is not reset at the same time as the memory structure. In such an embodiment the memory structure's output bus values are determined in a reset situation wholly on the basis of the switch elements' 20 outputs and, thus, on the basis of the fixed values of said second signal inputs. Otherwise, the operation of the embodiment shown in FIG. 3 is identical with that of the embodiment shown in FIG. 1.

Figure 4:
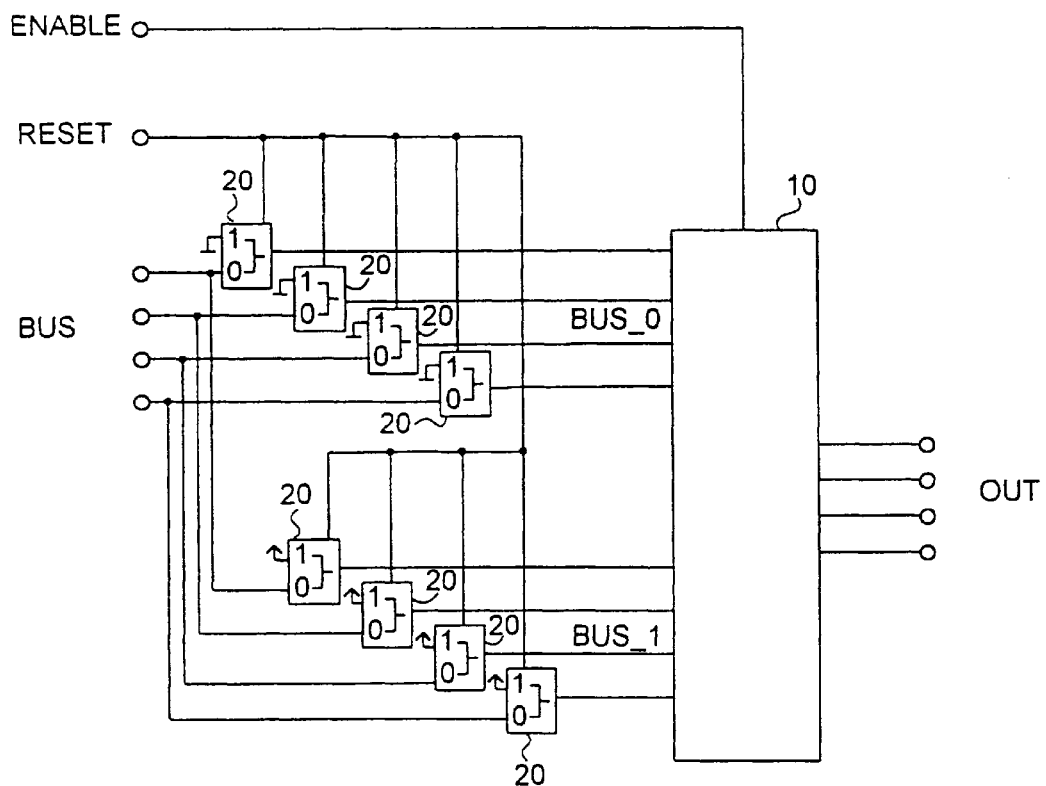
FIG. 4 shows a third preferred embodiment of the invention.
Figure 5:
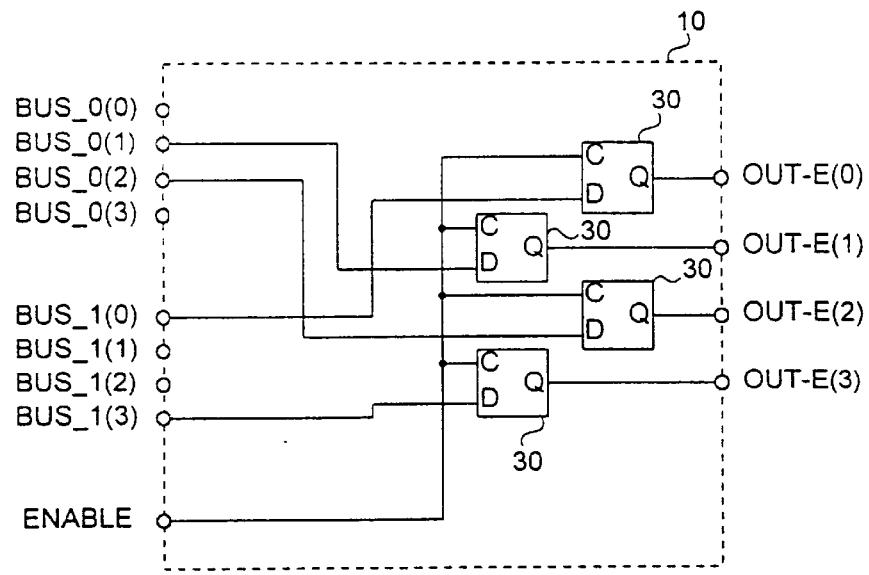
FIG. 5 shows the structure of a memory element 10 used in the embodiment shown in FIG. 4.

FIG. 4 shows a possible embodiment of the invention. In this embodiment there are two switch elements 20 per each input bus line, the output of the first switch element having the value "1" in the reset state and the output of the second switch element having the value "0" in the reset state. In this embodiment, two buses BUS_0, BUS_1 are brought to the memory element 10, said two buses having identical values in normal situation but opposite values in the reset state. Each latch circuit 30 in the memory element 10 is connected to either the first or the second bus, depending on what the reset state of the corresponding line on the memory structure's output bus should be. FIG. 5 shows an exemplary memory element 10 structure suitable to the embodiment shown in FIG. 4. However, the embodiment depicted in FIG. 4 is not optimal as regards minimisation of the number of circuit elements, as half of the switch elements 20 are unconnected. If these switch elements are left out of the structure, the structure will revert to the one shown in FIG. 3.

Figure 6:
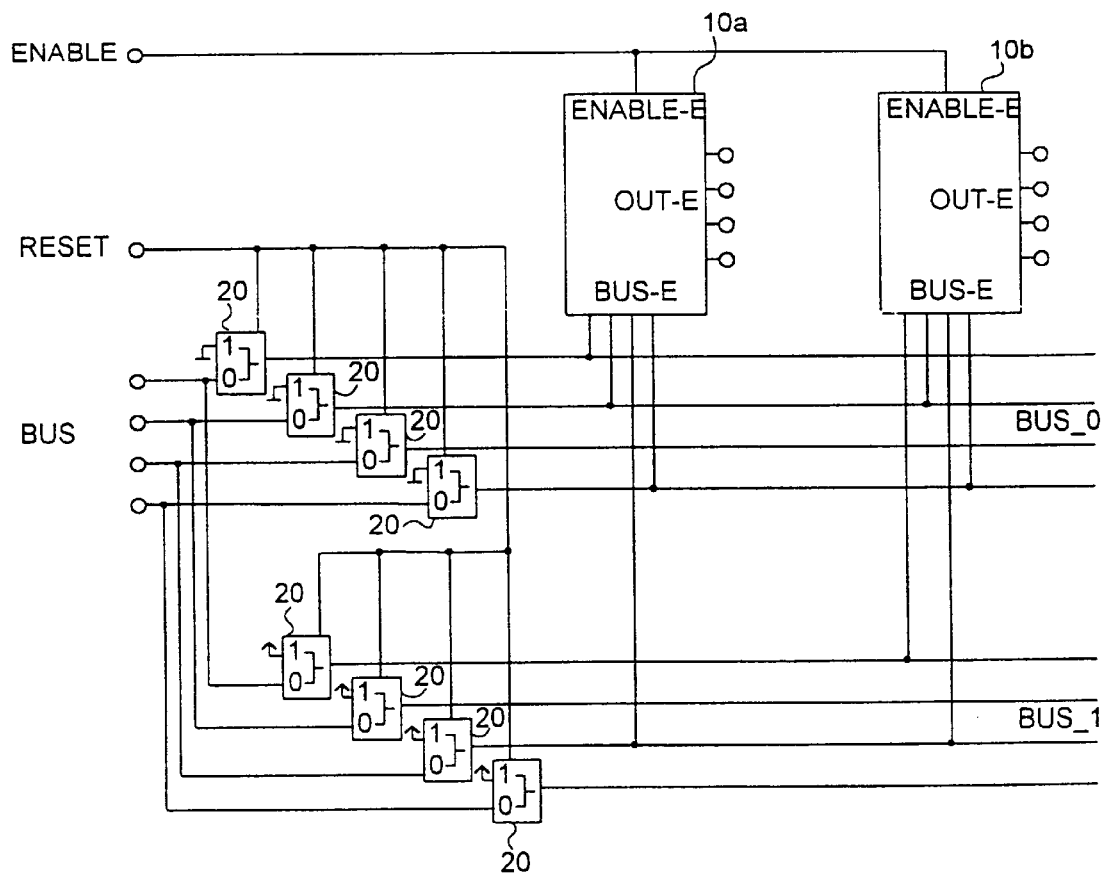
FIG. 6 shows the utilisation of the duplicated bus structure according to FIG. 4 with more than one memory element.

FIG. 6 shows an embodiment of the invention wherein the bus duplicated by means of switch elements 20, as shown in FIG. 4, is utilised in the control of more than one memory element 10a, 10b. In this kind of a structure the reset-state values of the memory element's 10a, 10b output bus are simply determined according to which one of the buses BUS_0, BUS_1 each line of the memory element's input bus is connected to. In the example of FIG. 6 the first memory element's 10a reset-state output values are "0010" and the second memory element's 10b reset-state output values are "1010". In this example there are two memory elements but more than two memory elements could be connected in a like manner.

The use of two parallel buses instead of one will not necessarily increase the need for space significantly. In a typical case of a large circuit the buses are narrow, say 8 or 16 bits, and the bus load is high: hundreds of memory elements may be connected to the bus. Because of the load, most of the bus lines typically have to be buffered by adding buffers in a tree-like manner. If the bus lines are divided in the manner shown in FIG. 6 into two less-loaded parts, the need for buffering will be reduced and the individual tree structures formed by buffers will become smaller. In the ideal case the need for space is nearly the same, or 8 * 1=2 * 8 * 0.5.

Figure 7:
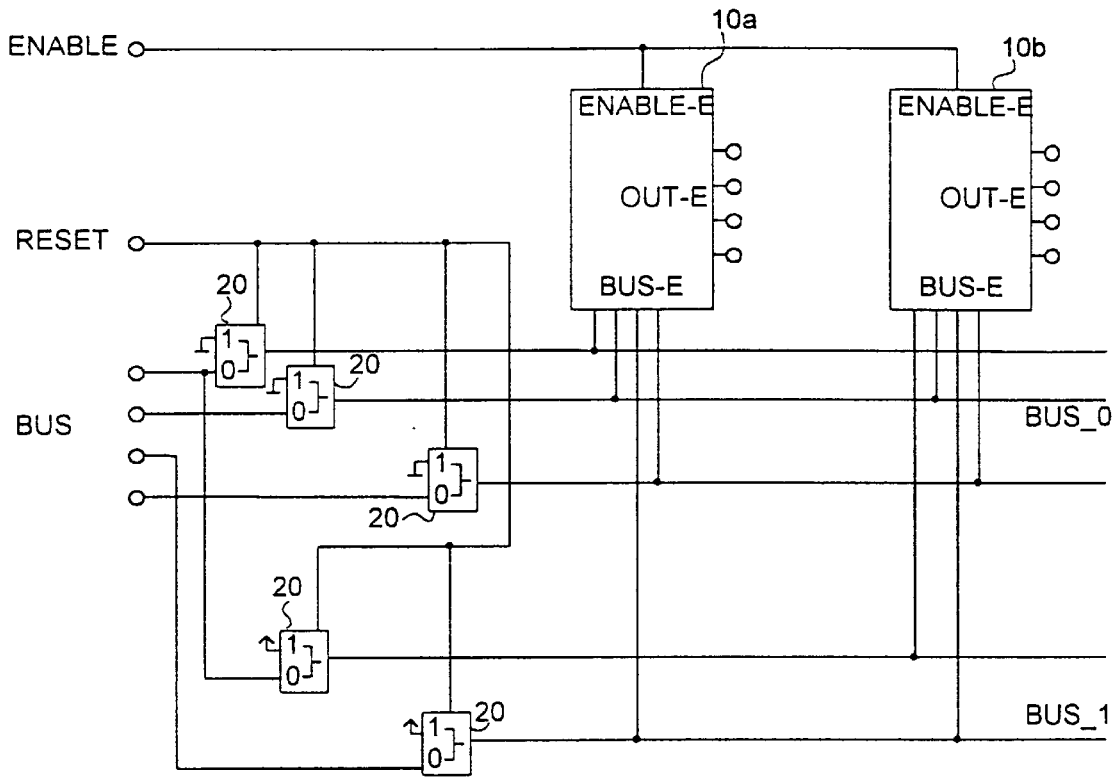
FIG. 7 shows a more advantageous version of the embodiment shown in FIG. 6.

In the example of FIG. 6 the third line of the first bus BUS_0 is not connected to either memory element 10a, 10b, nor are the second and fourth lines of the second bus BUS_1 connected to either memory element 10a, 10b. In the solution according to the invention such unconnected lines and the corresponding switch elements 20 can be advantageously left unimplemented as shown in FIG. 7. In the preferred embodiment according to FIG. 7, only the necessary portion of the lines of the input bus (BUS) are duplicated: in this example, the first line only. In the design of a circuit comprising the memory structure according to the invention one can advantageously use the structure according to FIG. 6 and in the final stages of design remove the unconnected lines and switch elements 20.

Figure 8:
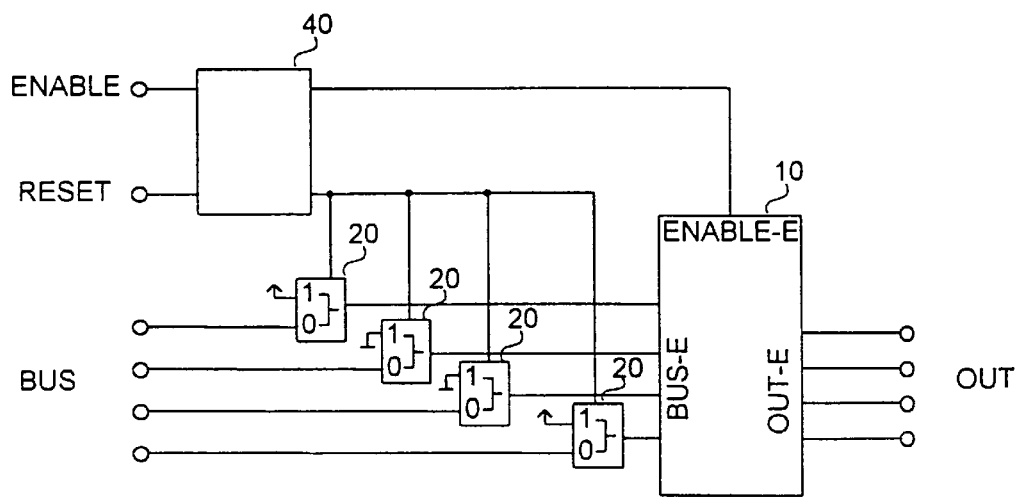
FIG. 8 shows an embodiment according to the invention using a control element 40.

FIG. 8 shows an embodiment of the invention wherein the memory structure comprises in addition to a memory element 10 and switch elements 20 a control element 40. The purpose of the control element 40 is to simplify the control of the memory structure such that the memory structure can be reset with only one pulse brought to the RESET input. In response to that reset pulse the control element 40 drives the switch elements 20 to the reset state whereby the outputs of the switch elements 20 get the fixed values of said second signal inputs, whereafter the control element 40 issues a control signal, say, a control pulse, to the memory element's 10 ENABLE-E input so that the memory element's 10 and thus the whole memory structure's output bus lines get the values determined by the switch elements 20.

Signals brought to the memory structure's ENABLE input are forwarded direct to the memory element 10 by the control element 40.

In the example of FIG. 8, the control element is by way of example applied to the embodiment shown in FIG. 3. The control element can in a like manner be applied to the other embodiments described in this application.

Figure 9:
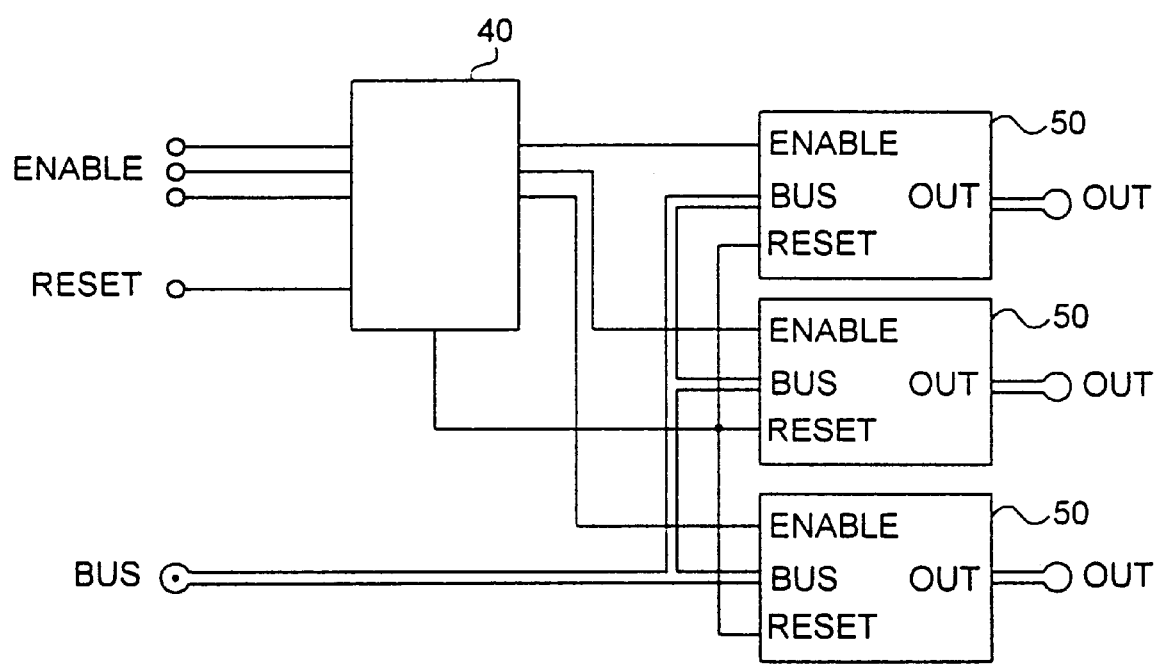
FIG. 9 shows another embodiment according to the invention using a control element 40.

FIG. 9 shows a preferred embodiment of the invention in which a plurality of memory units comprising a structure similar to one of those described above are connected in parallel under the control of one control element 40. In FIG. 9, the memory unit 50 is preferably a memory unit comprising the structure depicted in FIG. 1, 3 or 4, for example. In the example of FIG. 9, the control element 40 is responsible for controlling the RESET and ENABLE signals of three memory units in the manner described above in connection with the description of FIG. 8.

The invention is particularly well suited to the implementation of registers in large ASICs requiring many processor controls.

All circuit elements mentioned are, as such, known to a person skilled in the art. In the examples described the buses are 4 bits wide, but in accordance with the prior art the bus width may vary according to the target application.

The most significant advantage of the invention is the possibility of using an arbitrary reset state combined with the saving of space brought about by simple memory elements. Space is further saved as in the structure according to the invention the reset control need not be brought separately to each memory element but the reset control can be combined with the circuit elements that generate the memory elements' ENABLE signals.

Above the invention was described with reference to some of its preferred embodiments, but it is obvious that the invention can be modified in many different ways without departing from the scope of the inventional idea defined by the claims set forth below.

What is claimed is:

1. A memory structure comprising
   a control signal input (ENABLE),
   an input data bus (BUS),
   at least one output data bus (OUT), and
   at least one memory element (10), which memory element (10) comprises
   a control signal input (ENABLE-E),
   an input data bus (BUS-E), and
   an output data bus (OUT-E);
   and said output data bus of said memory element being functionally connected to the corresponding output data bus of the memory structure,
   said memory element being arranged to copy the values of the memory element's input data bus (BUS-E) lines to the memory element's output data bus (OUT-E) lines as a response to a control signal at the memory element's control signal input (ENABLE-E), characterised in that the memory structure further comprises
   a first bus (BUS_0),
   a second bus (BUS_1),
   one corresponding switch element (20) for each line of said first bus (BUS_0) and for each line of said second bus (BUS_1), which switch element comprises an input for receiving a reset signal, and in that,
   that each line of said first bus (BUS_0) is functionally connected via the corresponding switch element (20) to a corresponding line of the input data bus of the memory structure, and
   that each line of said second bus (BUS_1) is functionally connected via the corresponding switch element (20) to a corresponding line of the input data bus of the memory structure; and in that,
   each switch element (20) connected to said first bus (BUS_0) is arranged to switch a first predefined value to the corresponding line of the first bus as a response to a reset signal at its input for receiving a reset signal,
   each switch element (20) connected to said second bus (BUS_1) is arranged to switch a second predefined value to the corresponding line of the second bus as a response to a reset signal at its input for receiving a reset signal, and in that,
   that said first predefined value and said second predefined value are different values; and in that, that
   at least one line of the input data bus (BUS-E) of at least one memory element (10) is functionally connected to the corresponding line of said first bus (BUS_0), at least one line of the input data bus (BUS-E) of at least one memory element (10) is functionally connected to the corresponding line of said second bus (BUS_1).

2. A memory structure according to claim 1, characterised in that said first bus (BUS_0) has as many lines as the input data bus (BUS) of the memory structure, and said second bus (BUS_1) has as many lines as the input data bus (BUS) of the memory structure.

3. A memory structure according to claim 1, characterised in that the memory element (10) comprises latch circuits (30) without reset inputs.

4. A memory structure according to claim 1, characterised in that the memory structure further comprises a reset input for receiving a reset signal and a control element (40), which is arranged to
   in response to a control signal at the memory structure's control signal input (ENABLE), issue a control signal to the control signal input (ENABLE-E) of at least one memory element, and
   in response to a reset signal at the memory structure's reset input (RESET),
a) issue a reset signal to the input for receiving a reset signal of each switch element (20),
b) issue a control signal to the control signal input (ENABLE-E) of at least one memory element (10) in order to copy the memory element's input data bus (BUS-E) values to the memory element's output data bus (OUT-E), and
c) drive each switch element (20) to connect the value of the corresponding line on the memory structure's input data bus (BUS) to the corresponding line of the bus (BUS_0, BUS_1) corresponding to the switch element.

* * * * *